US008648630B2

(12) United States Patent
Yang et al.

(10) Patent No.: US 8,648,630 B2
(45) Date of Patent: Feb. 11, 2014

(54) SYSTEMS AND METHODS FOR DRIVING TRANSISTORS WITH HIGH THRESHOLD VOLTAGES (75) Inventors: Jiqing Yang, Shanghai (CN); Meng Li, Shanghai (CN); Qiang Luo, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/297,085

(22) Filed: Nov. 15, 2011

(65) Prior Publication Data

US 2013/0093474 A1    Apr. 18, 2013

(30) Foreign Application Priority Data

Oct. 12, 2011    (CN) .......................... 2011 1 0317087

(51) Int. Cl.
   *H03B 1/00*      (2006.01)
   *H03K 3/00*      (2006.01)
(52) U.S. Cl.
   USPC ............ 327/109; 327/108; 327/110; 327/112

(58) Field of Classification Search
   USPC .................................................. 327/108, 109
   See application file for complete search history.

(56) References Cited

U.S. PATENT DOCUMENTS 5,543,740 A * 8/1996 Wong ............................ 327/108

* cited by examiner

*Primary Examiner* — John Poos
(74) *Attorney, Agent, or Firm* — Jones Day (57) ABSTRACT

System and method are provided for driving a transistor. The system includes a floating-voltage generator, a first driving circuit, and a second driving circuit. The floating-voltage generator is configured to receive a first bias voltage and generate a floating voltage, the floating-voltage generator being further configured to change the floating voltage if the first bias voltage changes and to maintain the floating voltage to be lower than the first bias voltage by a first predetermined value in magnitude. The first driving circuit is configured to receive an input signal, the first bias voltage and the floating voltage. The second driving circuit is configured to receive the input signal, a second bias voltage and a third bias voltage, the first driving circuit and the second driving circuit being configured to generate an output signal to drive a transistor.

26 Claims, 8 Drawing Sheets

SYSTEMS AND METHODS FOR DRIVING TRANSISTORS WITH HIGH THRESHOLD VOLTAGES

1. CROSS-REFERENCES TO RELATED APPLICATIONS

This application claims priority to Chinese Patent Application No. 201110317087.1, filed Oct. 12, 2011, commonly assigned, incorporated by reference herein for all purposes.

2. BACKGROUND OF THE INVENTION

The present invention is directed to integrated circuits. More particularly, the invention provides systems and methods for driving transistors. Merely by way of example, the invention has been applied for driving a transistor with a high threshold voltage. But it would be recognized that the invention has a much broader range of applicability.

In high voltage applications, a power field-effect transistor (FET) often should have a high drain-source breakdown voltage (e.g., ≥100 V). Such a power FET usually has a threshold voltage of 3-4 V. Using a gate driver with a low output voltage, for example, 5 V to drive the power FET often results in a high turn-on resistance or incomplete turn-on of the power FET. Hence, a gate driver with a relatively high output voltage that is larger than 5 V (e.g., the output voltage being 8-10 V) is often needed.

Figure 1:
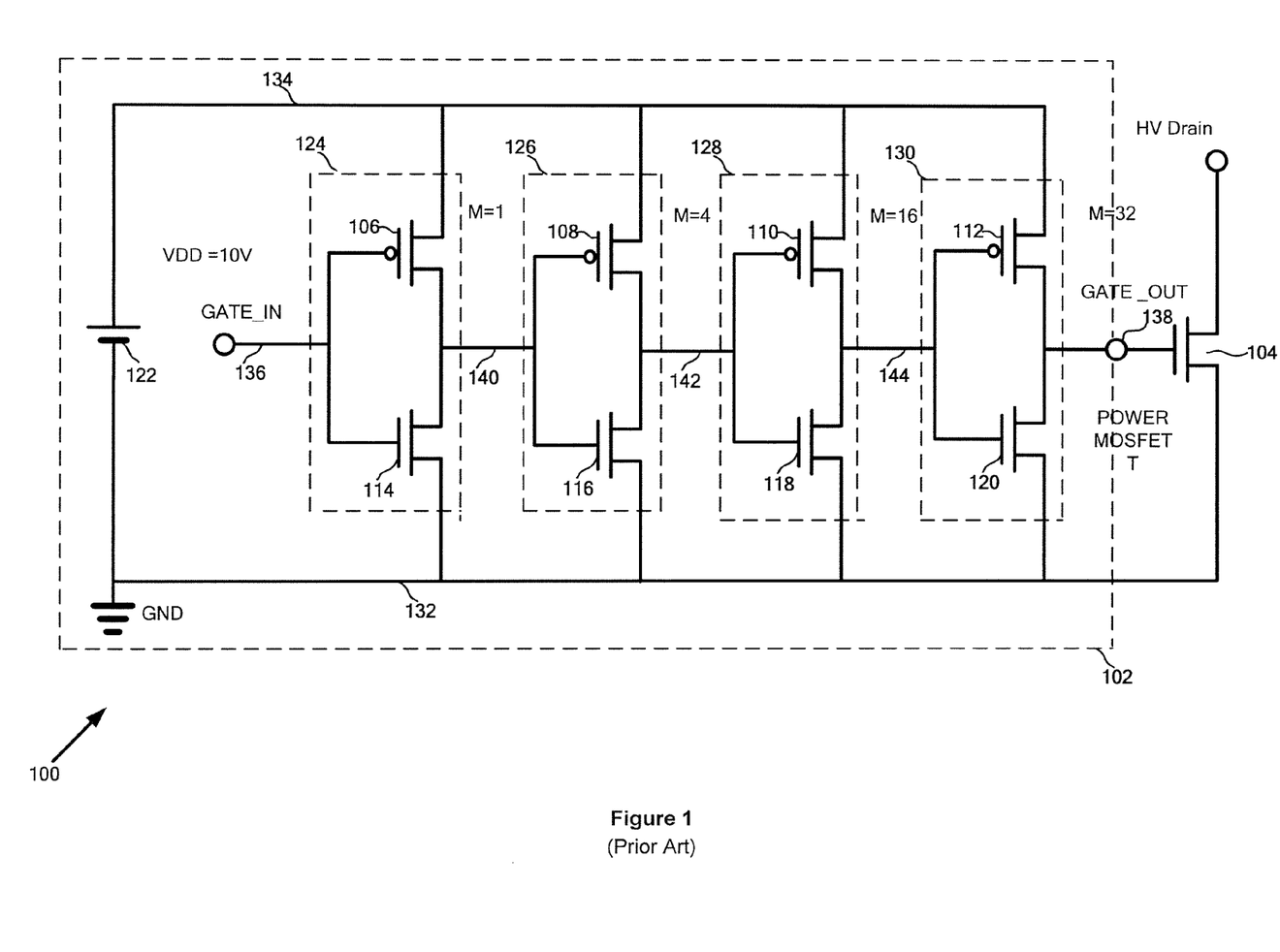
FIG. 1 is a simplified conventional diagram showing a system for driving a transistor.

FIG. 1 is a simplified conventional diagram showing a system 100 for driving a transistor 104. The gate-driving system 100 includes a gate driver 102 and a transistor 104. The gate driver 102 includes a power source 122, and four inverters 124, 126, 128 and 130. The inverter 124 includes transistors 106 and 114 that are connected with each other, and the inverter 126 includes transistors 108 and 116 that are connected with each other. Additionally, the inverter 128 includes transistors 110 and 118 that are connected with each other, and the inverter 130 includes transistors 112 and 120 that are connected with each other. The four inverters 124, 126, 128 and 130 are connected in cascade. For example, the transistors 106, 108, 110, and 112 are P-channel FETs, and the transistors 114, 116, 118, and 120 are N-channel FETs. In another example, the transistor 104 is a power FET. The power source 122 provides a low-level bias voltage 132 (e.g., GND) and a high-level bias voltage 134 (e.g., $V_{DD}$) to each of the cascaded inverters 124, 126, 128 and 130.

An input signal 136 (e.g., GATE_IN) is received by the cascaded inverters 124, 126, 128 and 130, and in response the gate driver 102 generates an output signal 138 to drive the transistor 104. Specifically, in operation, the inverter 124 receives the input signal 136 (e.g., GATE IN), and generates a first inverted signal 140. The inverter 126 receives the first inverted signal 140, and generates a second inverted signal 142 which is received by the inverter 128. The inverter 128 then generates a third inverted signal 144 which is received by the inverter 130. The inverter 130 finally generates the output signal 138 for driving the transistor 104. For example, if the input signal 136 is at a logic high level, the transistor 106 is turned off and the transistor 114 is turned on. Then the first inverted signal 140 is generated to be approximately equal to the low-level bias voltage 132 (e.g., GND). The inverter 126 receives the first inverted signal 140, and the transistor 108 is turned on while the transistor 116 is turned off The second inverted signal 142 is generated to be approximately equal to the high-level bias voltage 134 (e.g., $V_{DD}$). In turn, the third inverted signal 144 is approximately equal to the low-level bias voltage 132 (e.g., GND), and the output signal 138 is approximately equal to the high-level bias voltage 134 (e.g., $V_{DD}$). Then, the transistor 104 is turned on by the output signal 138 if the transistor 104 is an N-channel FET. In another example, when the input signal 136 is at a logic low level, then the transistor 104 is turned off by the output signal 138 if the transistor 104 is an N-channel FET.

Usually, the transistors in the gate driver 102 (e.g., the transistor 106, etc.) are high voltage devices of which manufacturing costs are often high. Further, these transistors usually have high turn-on resistance, and low driving capability per unit area. Hence, to drive a same load, the transistors in the gate driver 102 often use larger areas than low voltage devices.

Figure 2:
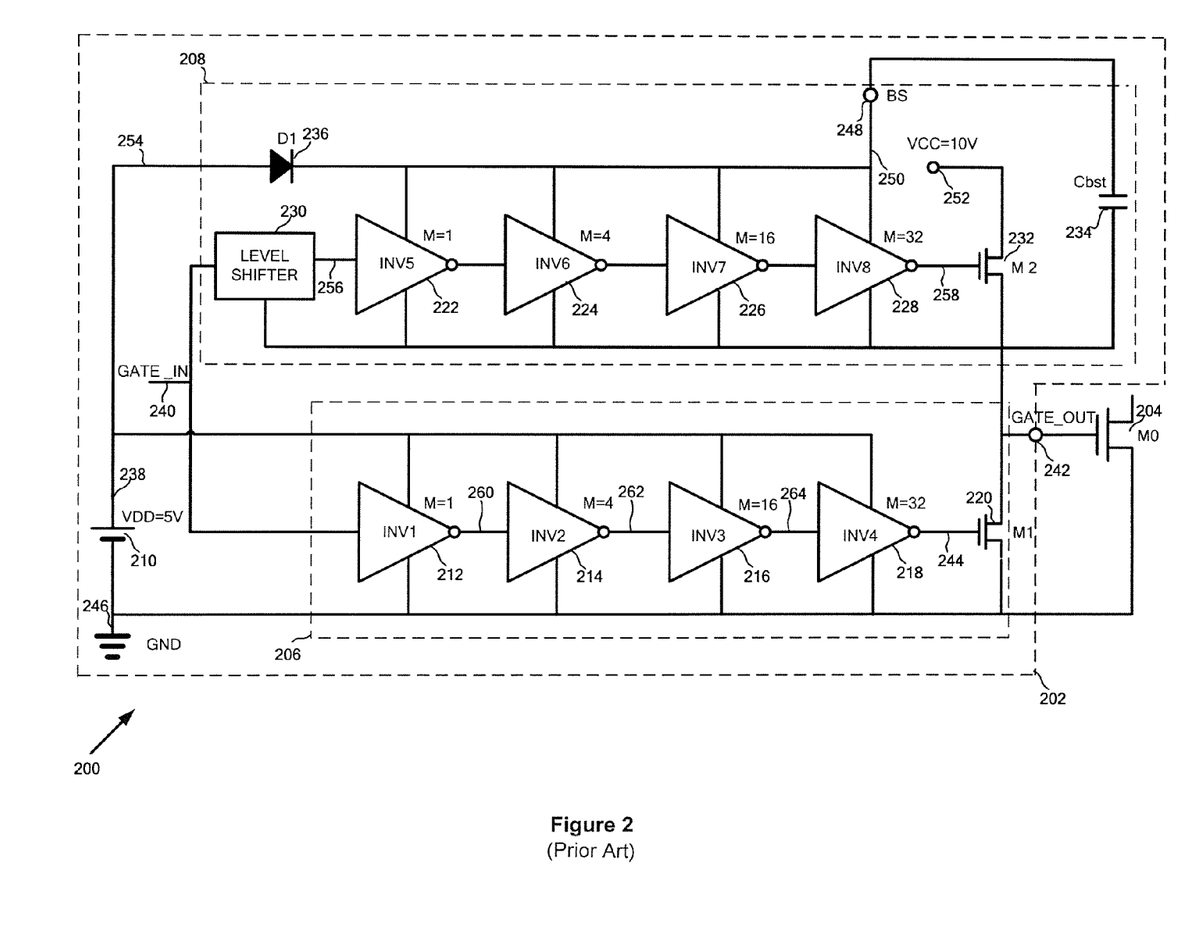
FIG. 2 is a simplified conventional diagram showing a system with a bootstrap structure for driving a transistor.

To improve the driving capability per unit area, a bootstrap structure and low voltage devices are often used in a gate driver. FIG. 2 is a simplified conventional diagram showing a system 200 with a bootstrap structure for driving a transistor 204. The gate-driving system 200 includes a gate driver 202 and a transistor 204. The gate driver 202 includes a low-side driver 206, a high-side driver 208, and a power source 210. The gate driver 202 further includes a bootstrap terminal 248 (e.g., BS). The low-side driver 206 includes the inverters 212, 214, 216 and 218, and a transistor 220. The high-side driver 208 includes the inverters 222, 224, 226 and 228, a level shifter 230, a transistor 232, a boost capacitor 234, and a diode 236. The inverters 212, 214, 216 and 218 are connected in cascade, and the inverters 222, 224, 226 and 228 are connected in cascade. For example, the transistors 220 and 232 are lateral-diffused MOSFETs (LDMOSs), such as lateral-diffused N-channel MOSFETs. In another example, the transistor 204 is a power FET.

The power source 210 provides a high-level bias voltage 238 (e.g., $V_{DD}$) and a low-level bias voltage 246 (e.g., GND) to each of the inverters in the low-side driver 206. An input signal 240 (e.g., GATE_IN) is provided to both the low-side driver 206, and the high-side driver 208, and the gate driver 202 generates in response an output signal 242 to drive the transistor 204. Specifically, in operation, in the low-side driver 206, the inverter 212 receives the input signal 240 (e.g., GATE IN), and generates a first inverted signal 260. The inverter 214 receives the first inverted signal 260, and generates a second inverted signal 262 which is received by the inverter 216. The inverter 216 then generates a third inverted signal 264 which is received by the inverter 218. The inverter 218 generates a signal 244 to drive the transistor 220. If the transistor 220 is turned on by the signal 244 while the transistor 232 is off, then the output signal 242 (e.g., GATE_OUT) becomes approximately equal to the low-level bias voltage 246 (e.g., GND). For example, the high-level bias voltage 238 (e.g., $V_{DD}$) is 5 V.

On the other hand, the input signal 240 is also received by the level shifter 230, and in response the level shifter 230 generates a signal 256. The cascaded inverters 222, 224, 226 and 228 receive the signal 256, and generate a signal 258 to drive the transistor 232. A high-level bias voltage 252 (e.g., $V_{cc}$) is provided to the transistor 232. If the transistor 232 is turned on by the signal 258 while the transistor 220 is off, then the output signal 242 (e.g., GATE_OUT) becomes approximately equal to the high-level bias voltage 252 (e.g., $V_{CC}$). For example, the bias voltage 252 (e.g., $V_{cc}$) is 10 V.

The boost capacitor 234 operates to increase the voltage of the bootstrap terminal 248 (e.g., BS) to be larger in magnitude than the output signal 242 (e.g., GATE_OUT) by a predetermined voltage, and to provide a voltage 250 for the high-side driver 208 to operate. The diode 236 operates to rectify a current 254 flowing from the power source 210 to the diode 236 in order to prevent a current flowing from the high-side driver 208 to the power source 210 if the voltage of the bootstrap terminal 248 (e.g., BS) becomes larger than the bias voltage 238 (e.g., $V_{DD}$) provided by the power source 210.

The conventional gate driver 202 usually uses a bootstrap structure including the boost capacitor 234 and the bootstrap terminal 248 (e.g., BS) to provide a proper operating voltage for the high-side driver 208. However, the boost capacitor 234 often has a capacitance of tens or hundreds of nanofarads, and hence may not be easily incorporated into an integrated-circuit (IC) chip. Further, the bootstrap terminal 248 is not suitable if terminals (e.g., pins) are limited on an IC chip. Additionally, the diode 236 is usually needed for the gate driver 202 for rectifying the current 254. If the diode 236 is a Schottky diode which often has good performance for rectification, manufacturing costs may increase.

Hence it is highly desirable to improve techniques of driving transistors with high threshold voltages.

3. BRIEF SUMMARY OF THE INVENTION

The present invention is directed to integrated circuits. More particularly, the invention provides systems and methods for driving transistors. Merely by way of example, the invention has been applied for driving a transistor with a high threshold voltage. But it would be recognized that the invention has a much broader range of applicability.

According to one embodiment, a system for driving a transistor includes a floating-voltage generator, a first driving circuit, and a second driving circuit. The floating-voltage generator is configured to receive a first bias voltage and generate a floating voltage, the floating-voltage generator being further configured to change the floating voltage if the first bias voltage changes and to maintain the floating voltage to be lower than the first bias voltage by a first predetermined value in magnitude. The first driving circuit is configured to receive an input signal, the first bias voltage and the floating voltage. The second driving circuit is configured to receive the input signal, a second bias voltage and a third bias voltage, the first driving circuit and the second driving circuit being configured to generate an output signal to drive a transistor. Additionally, the first driving circuit includes a first driving transistor, the first driving transistor being configured to receive the first bias voltage and a first gate signal, the first gate signal being associated with at least the input signal, the first bias voltage, and the floating voltage. The second driving circuit includes a second driving transistor, the second driving transistor being configured to receive the third bias voltage and a second gate signal, the second gate signal being associated with at least the input signal, the second bias voltage, and the third bias voltage. The first driving transistor and the second driving transistor are further configured to generate the output signal. Moreover, if the first driving transistor is turned on by the first gate signal, the second driving transistor is turned off by the second gate signal. If the first driving transistor is turned off by the first gate signal, the second driving transistor is turned on by the second gate signal.

According to another embodiment, a method for driving a transistor includes receiving a first bias voltage, processing information associated with the first bias voltage, and generating a floating voltage based on at least information associated with the first bias voltage. The method further includes receiving an input signal, the first bias voltage, a second bias voltage, a third bias voltage, and the floating voltage, processing information associated with the input signal, the first bias voltage, the second bias voltage, the third bias voltage and the floating voltage, and generating an output signal to drive a transistor based on at least information associated with the input signal, the first bias voltage, the second bias voltage, the third bias voltage and the floating voltage. Additionally, the process for generating the floating voltage based on at least information associated with the first bias voltage includes: changing the floating voltage if the first bias voltage changes, and maintaining the floating voltage to be lower than the first bias voltage by a first predetermined value in magnitude.

According to yet another embodiment, a system for driving a transistor includes a first driving circuit and a second driving circuit. The first driving circuit is configured to receive an input signal, a first bias voltage and a second bias voltage, the first driving circuit including a current mirror circuit, a switch, and a current sink. The second driving circuit is configured to receive the input signal and the second bias voltage, the first driving circuit and the second driving circuit being configured to generate an output signal to drive a transistor. Additionally, the switch is configured to receive the input signal. The current sink is configured to generate a first current. The current mirror circuit is coupled to the current sink through the switch and configured to generate a second current based on the first current. Moreover, the output signal is generated based on at least information associated with the second current.

According to yet another embodiment, a method of driving a transistor includes receiving an input signal, a first bias voltage and a second bias voltage, processing information associated with the input signal, the first bias voltage and the second bias voltage, and generating a first current based on at least information associated with the input signal, the first bias voltage and the second bias voltage. The method further includes processing information associated with the first current, generating a second current based on at least information associated with the first current, and processing information associated with the second current. Additionally, the method includes generating an output signal to drive a transistor based on at least information associated with the second current. Moreover, the second current is proportional to the first current in magnitude.

Many benefits are achieved by way of the present invention over conventional techniques. Certain embodiments of the present invention use a low dropout regulator (LDO) that sinks currents to provide a proper operating voltage for driving a transistor, without using a conventional high-voltage-device gate-driving structure or a bootstrap structure. Some embodiments of the present invention provide a proper operating voltage for driving a transistor, without using a boost capacitor or a bootstrap terminal. Certain embodiments of the present invention use low-voltage devices to construct a gate-driving structure and provide a cost-effective solution for driving a transistor.

Depending upon embodiment, one or more benefits may be achieved. These benefits and various additional objects, features and advantages of the present invention can be fully appreciated with reference to the detailed description and accompanying drawings that follow.

5. DETAILED DESCRIPTION OF THE INVENTION

The present invention is directed to integrated circuits. More particularly, the invention provides systems and methods for driving transistors. Merely by way of example, the invention has been applied for driving a transistor with a high threshold voltage. But it would be recognized that the invention has a much broader range of applicability.

Figure 3:
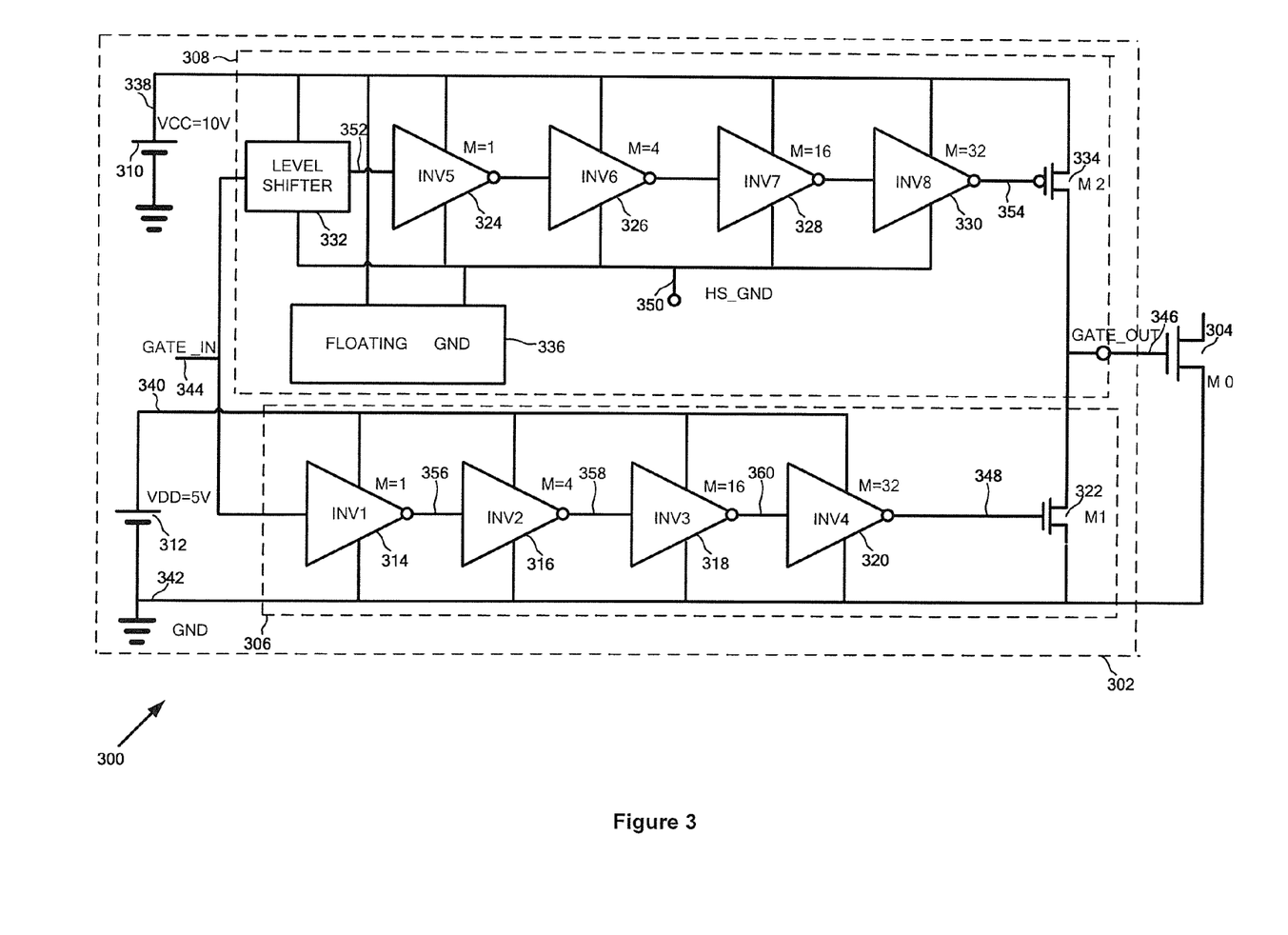
FIG. 3 is a simplified diagram showing a system for driving a transistor according to an embodiment of the present invention.

FIG. 3 is a simplified diagram showing a system 300 for driving a transistor according to an embodiment of the present invention. This diagram is merely an example, which should not unduly limit the scope of the claims. One of ordinary skill in the art would recognize many variations, alternatives, and modifications.

The gate-driving system 300 includes a gate driver 302 and a transistor 304. The gate driver 302 includes a low-side driver 306, a high-side driver 308, and two power sources 310 and 312. The low-side driver 306 includes the inverters 314, 316, 318 and 320, and a transistor 322. The high-side driver 308 includes the inverters 324, 326, 328 and 330, a level shifter 332, a transistor 334, and a floating-ground component 336. For example, the inverters 314, 316, 318 and 320 are connected in cascade. In another example, the inverters 324, 326, 328 and 330 are connected in cascade. In yet another example, the transistor 304 is a power FET. In yet another example, the transistor 322 is an N-channel FET. In yet another example, the transistor 334 is a P-channel FET.

According to one embodiment, the power source 312 provides a high-level bias voltage 340 (e.g., $V_{DD}$) and a low-level bias voltage 342 (e.g., GND) to the low-side driver 306. For example, the power source 310 provides a high-level bias voltage 338 (e.g., $V_{CC}$) to the high-side driver 308. In another example, the high-level bias voltage 340 (e.g., $V_{DD}$) is 5 V. In yet another example, the high-level bias voltage 338 (e.g., $V_{CC}$) is 10 V.

According to another embodiment, an input signal 344 (e.g., GATE_IN) is provided to both the low-side driver 306, and the high-side driver 308. For example, in response, the gate driver 302 generates an output signal 346 (e.g., GATE_OUT) for driving the transistor 304. In another example, in operation, in the low-side driver 306, the inverter 314 receives the input signal 344 (e.g., GATE IN), and generates a first inverted signal 356. In yet another example, the inverter 316 receives the first inverted signal 356, and generates a second inverted signal 358 which is received by the inverter 318. In yet another example, the inverter 318 then generates a third inverted signal 360 which is received by the inverter 320. In yet another example, the inverter 320 generates a signal 348 to drive the transistor 322. In yet another example, if the transistor 334 in the high-side driver 308 is turned off, the transistor 322 is turned on by the signal 348. In yet another example, the output signal 346 (e.g., GATE_OUT) becomes approximately equal to the low-level bias voltage 342 (e.g., GND).

According to yet another embodiment, the level shifter 332 receives the input signal 344 (e.g., GATE_IN), and in response generates a signal 352. For example, the cascaded inverters 324, 326, 328 and 330 receive the signal 352, and generate a signal 354 to drive the transistor 334. In another example, if the transistor 322 is turned off by the signal 348, the transistor 334 is turned on by the signal 354. In yet another example, the output signal 346 (e.g., GATE_OUT) becomes approximately equal to the high-level bias voltage 338 (e.g., $V_{CC}$).

According to yet another embodiment, the floating-ground component 336 receives the high-level bias voltage 338 (e.g., $V_{CC}$), and in response generates a floating-ground signal 350 (e.g., HS_GND). For example, the floating-ground component 336 automatically tracks the high-level bias voltage 338 (e.g., $V_{CC}$) to generate the floating-ground signal 350 (e.g., HS_GND). In another example, if the high-level bias voltage 338 (e.g., $V_{CC}$) changes continuously in magnitude, the floating-ground component 336 automatically changes the floating-ground signal 350 (e.g., HS_GND) continuously in magnitude to follow the high-level bias voltage 338 (e.g., $V_{CC}$). In yet another example, the floating-ground signal 350 (e.g., HS_GND) is maintained to be lower in magnitude than the high-level bias voltage 338 (e.g., $V_{CC}$) by a predetermined voltage $V_0$. In another example, the floating-ground signal 350 (e.g., HS_GND) is provided as a bias voltage to the cascaded inverters 324, 326, 328 and 330, and the level shifter 332. In yet another example, the operating voltage of the high-side driver 308 is no larger than the difference between the high-level bias voltage 338 (e.g., $V_{CC}$) and the floating-ground signal 350 (e.g., HS_GND), e.g., the predetermined voltage $V_0$. In yet another example, the predetermined voltage $V_0$ is 5 V.

Figure 4:
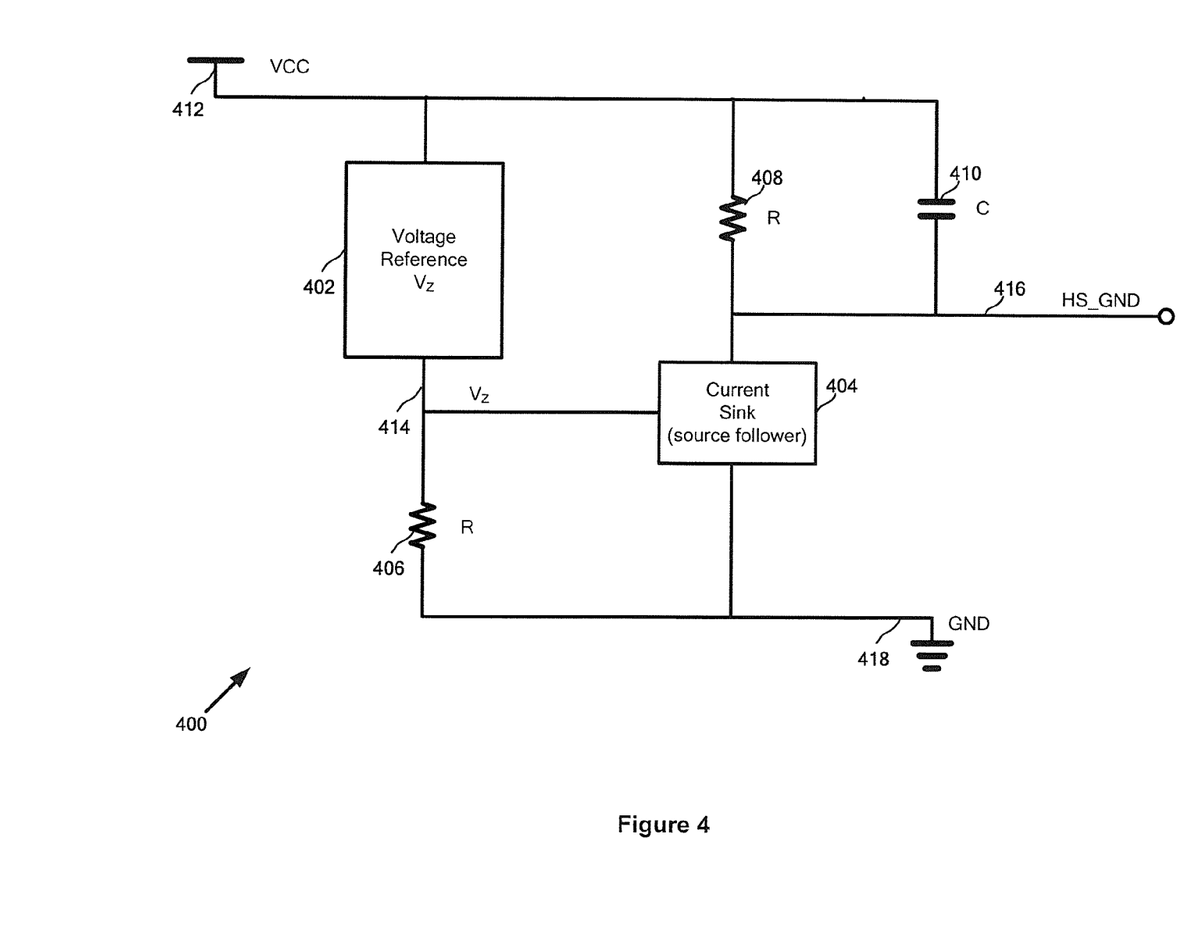
FIG. 4 is a simplified diagram showing a floating-ground component for generating a floating-ground signal according to an embodiment of the present invention.

FIG. 4 is a simplified diagram showing a floating-ground component 400 for generating a floating-ground signal according to an embodiment of the present invention. This diagram is merely an example, which should not unduly limit the scope of the claims. One of ordinary skill in the art would recognize many variations, alternatives, and modifications. The floating-ground component 400 includes a reference-voltage generator 402, a current sink 404, two resistors 406 and 408, and a capacitor 410. For example, the floating-ground component 400 is the same as the floating-ground component 336 as part of the gate-driving system 300.

According to one embodiment, the resistor 408 and the capacitor 410 are coupled with each other in parallel. For example, the resistor 408 and the capacitor 410 are coupled to the current sink 404 and the reference-voltage generator 402. In another example, the resistor 406 is coupled to the reference-voltage generator 402 and the current sink 404. In yet another example, the current sink 404 is a source follower. In yet another example, the current sink 404 is an emitter follower.

According to another embodiment, a high-level bias voltage 412 (e.g., $V_{CC}$) is provided to the reference-voltage generator 402, the resistor 408 and the capacitor 410. For example, the reference-voltage generator 402 in response generates a reference voltage signal 414 (e.g., $V_Z$). In another example, the reference-voltage generator 402 changes the reference voltage signal 414 (e.g., $V_Z$) if the high-level bias voltage 412 (e.g., $V_{CC}$) changes. In yet another example, the resistor 406 and the current sink 404 receive the reference voltage signal 414 (e.g., $V_Z$). In yet another example, the current sink 404 and the resistor 406 also receive a low-level bias voltage 418 (e.g., GND). In yet another example, a floating-ground signal 416 (e.g., HS_GND) is generated by the floating-ground component 400. In yet another example, the difference between the high-level bias voltage 412 (e.g., $V_{CC}$) and the floating-ground signal 416 (e.g., HS_GND) can be kept no larger than a predetermined voltage $V_1$ by properly adjusting the reference voltage signal 414 (e.g., $V_Z$) and the voltage of the current sink 404. In yet another example, the floating-ground signal 416 (e.g., HS_GND) is lower than the high-level bias voltage 412 (e.g., $V_{CC}$). In yet another example, the floating-ground signal 416 (e.g., HS_GND) is the same as the floating-ground signal 350. In yet another example, the current sink 404 (e.g., a source follower or an emitter follower) operates together with the resistor 408 for sinking currents and keeping the magnitude of the floating-ground signal 416 (e.g., HS_GND) approximately at a desired level. In yet another example, the high-level bias voltage 412 (e.g., $V_{CC}$) is 10 V. In yet another example, the predetermined voltage $V_1$ is 5 V. In yet another example, the reference voltage signal 414 (e.g., $V_Z$) is maintained to be lower than the high-level bias voltage 412 (e.g., $V_{CC}$) by a predetermined value $V_r$ in magnitude. In yet another example, the predetermined value $V_r$ is different from the predetermined voltage $V_1$.

Figure 5:
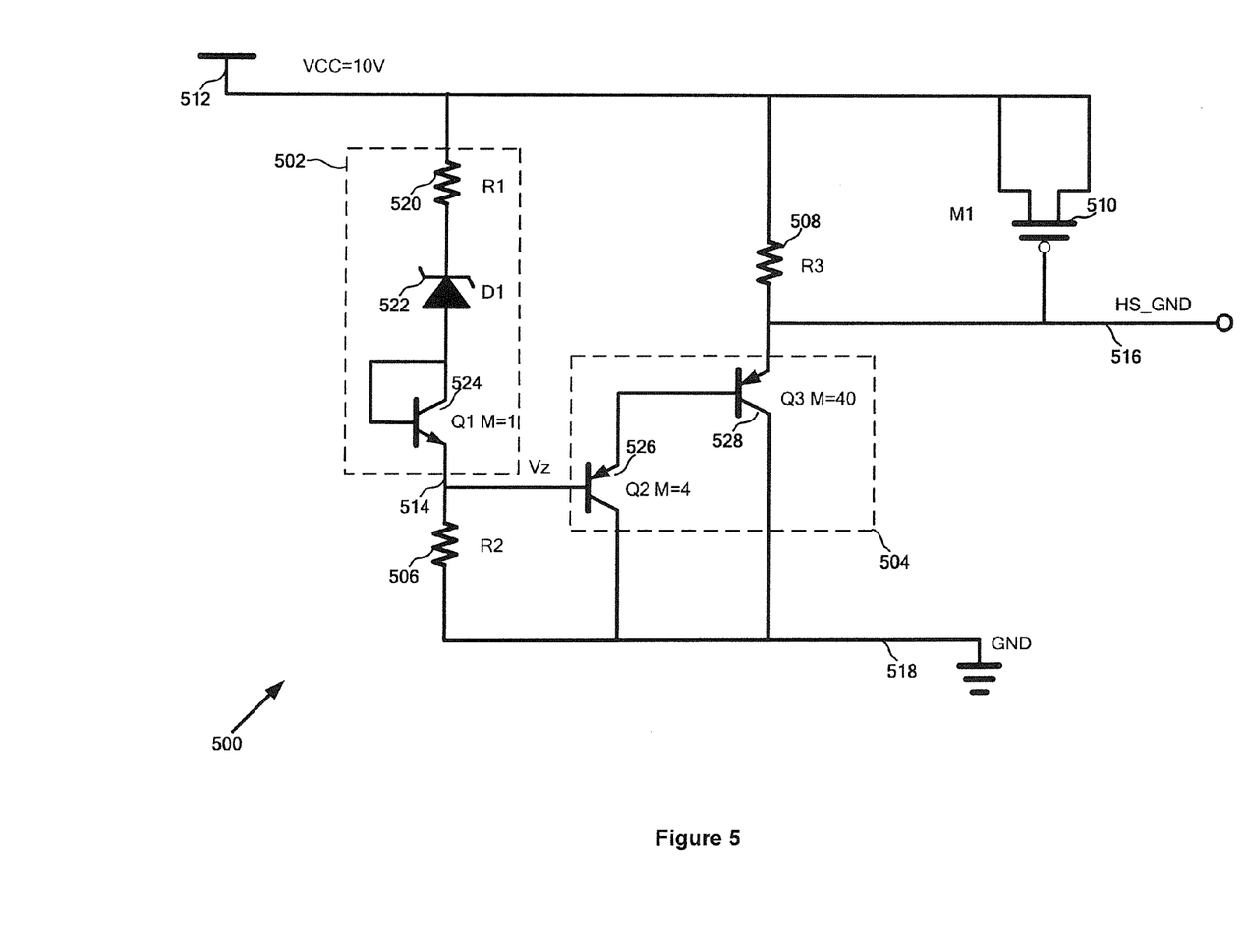
FIG. 5 is a simplified diagram showing a floating-ground component for generating a floating-ground signal according to one embodiment of the present invention.

FIG. 5 is a simplified diagram showing a floating-ground component 500 for generating a floating-ground signal according to one embodiment of the present invention. This diagram is merely an example, which should not unduly limit the scope of the claims. One of ordinary skill in the art would recognize many variations, alternatives, and modifications.

The floating-ground component 500 includes a reference-voltage generator 502, a current sink 504, two resistors 506 and 508, and a transistor 510. The reference-voltage generator 502 includes a resistor 520, a diode 522, and a transistor 524. The current sink 504 includes two transistors 526 and 528. For example, the floating-ground component 500 is the same as the floating-ground component 336 as part of the gate-driving system 300. In another example, the floating-ground component 500 is the same as the floating-ground component 400. In yet another example, the diode 522 is a Zener diode. In yet another example, the transistor 524 is an N-P-N bipolar junction transistor (BJT). In yet another example, the transistors 526 and 528 are Darlington-connected P-N-P BJTs. In yet another example, the transistor 510 is a P-channel FET.

According to one embodiment, the source and drain of the transistor 510 are coupled together. For example, the resistor 508 and the transistor 510 are coupled with each other. In another example, the resistor 508 and the transistor 510 are coupled to the current sink 504 and the reference-voltage generator 502. In yet another example, the resistor 506 is coupled to the reference-voltage generator 502 and the current sink 504.

According to another embodiment, a high-level bias voltage 512 (e.g., $V_{CC}$) is provided to the reference-voltage generator 502, the resistor 508 and the transistor 510. For example, the reference-voltage generator 502 in response generates a reference voltage signal 514 (e.g., $V_Z$). In another example, the resistor 506 and the current sink 504 receive the reference voltage signal 514 (e.g., $V_Z$). In yet another example, the current sink 504 and the resistor 506 also receive a low-level bias voltage 518 (e.g., GND). In yet another example, a floating-ground signal 516 (e.g., HS_GND) is generated by the floating-ground component 500. In yet another example, the difference between the high-level bias voltage 512 (e.g., $V_{CC}$) and the floating-ground signal 516 (e.g., HS_GND) can be kept no larger than a predetermined voltage $V_2$ by properly adjusting the reference voltage signal 514 (e.g., $V_Z$) and the voltage of the current sink 504. In yet another example, the floating-ground signal 516 (e.g., HS_GND) is lower than the high-level bias voltage 512 (e.g., $V_{CC}$). In yet another example, the floating-ground signal 516 (e.g., HS_GND) is the same as the floating-ground signal 350 or the floating-ground signal 416. In yet another example, the high-level bias voltage 512 (e.g., $V_{CC}$) is 10 V. In yet another example, the predetermined voltage $V_2$ is 5 V.

According to yet another embodiment, the resistor 520 operates for adjusting the difference between the high-level bias voltage 512 (e.g., $V_{CC}$) and the floating-ground signal 516 (e.g., HS_GND). For example, the transistors 526 and 528 operate together with the resistor 508 for sinking currents and keeping the magnitude of the floating-ground signal 516 (e.g., HS_GND) approximately at a desired level. In another example, the transistor 510 operates as a capacitor to keep the difference between the high-level bias voltage 512 (e.g., $V_{CC}$) and the floating-ground signal 516 (e.g., HS_GND) from changing significantly. In yet another example, the transistor 524 operates to reduce the effect of the base-emitter voltage of the transistor 526 on the floating-ground signal 516 (e.g., HS_GND). In yet another example, the resistor 506 operates to provide a direct current path for the diode 522 and the transistor 526.

According to yet another embodiment, the difference between the high-level bias voltage 512 (e.g., $V_{cc}$) and the floating-ground signal 516 (e.g., HS_GND) can be determined based on the following equation:

$$V_{CC} - V_{HS\_GND} = I_b \times R_1 + V_{bk\_zener} + V_{BE1} - V_{BE2} - V_{BE3} \quad \text{(Equation 1)}$$

where $V_{CC}$ represents the high-level bias voltage 512, and $V_{HS\_GND}$ represents the floating-ground signal 516. Additionally, $I_b$ represents a reverse break-down current of the diode 522, $V_{bk\_zener}$ represents a reverse break-down voltage of the diode 522, and $R_1$ represents the resistance of the resistor 520. Furthermore, $V_{BE1}$ represents the base-emitter voltage of the transistor 524, $V_{BE2}$ represents the base-emitter voltage of the transistor 526, and $V_{BE3}$ represents the base-emitter voltage of the transistor 528.

For example, according to Equation 1, the resistance of the resistor 520 (e.g., $R_1$) can be set properly based on certain device characteristics of the diode 522 (e.g., a particular relationship of the reverse break-down voltage and the reverse break-down current of the diode 522) in order to keep the difference between the high-level bias voltage 512 and the floating-ground signal 516 no larger than the predetermined voltage $V_2$. In another example, the reverse break-down voltage of the diode 522 (e.g., $V_{bk\_zener}$) is equal to 6 V, the base-emitter voltage of the transistor 524 (e.g., $V_{BE1}$) and the base-emitter voltage of the transistor 526 (e.g., $V_{BE2}$) are both equal to the forward voltage of their respective diodes, for example, 0.65 V, and the base-emitter voltage of the transistor 528 (e.g., $V_{BE3}$) is equal to another forward voltage of its respective diode, for example, 0.8 V. Then, the difference between the high-level bias voltage 512 and the floating-ground signal 516 can be determined, according to Equation 1, to be equal to 5.2 V, according to certain embodiments. In another example, the resistance of the resistor 520 (e.g., $R_1$) can be adjusted properly to reduce the deviation of the floating-ground signal 516 caused by random manufacturing errors.

According to yet another embodiment, the transistors 526 and 528 are Darlington-connected P-N-P BJTs, and receive the voltage signal 514 (e.g., $V_Z$). For example, the transistors 526 and 528 operate together with the resistor 508 to form an emitter follower as a current sink.

Figure 6:
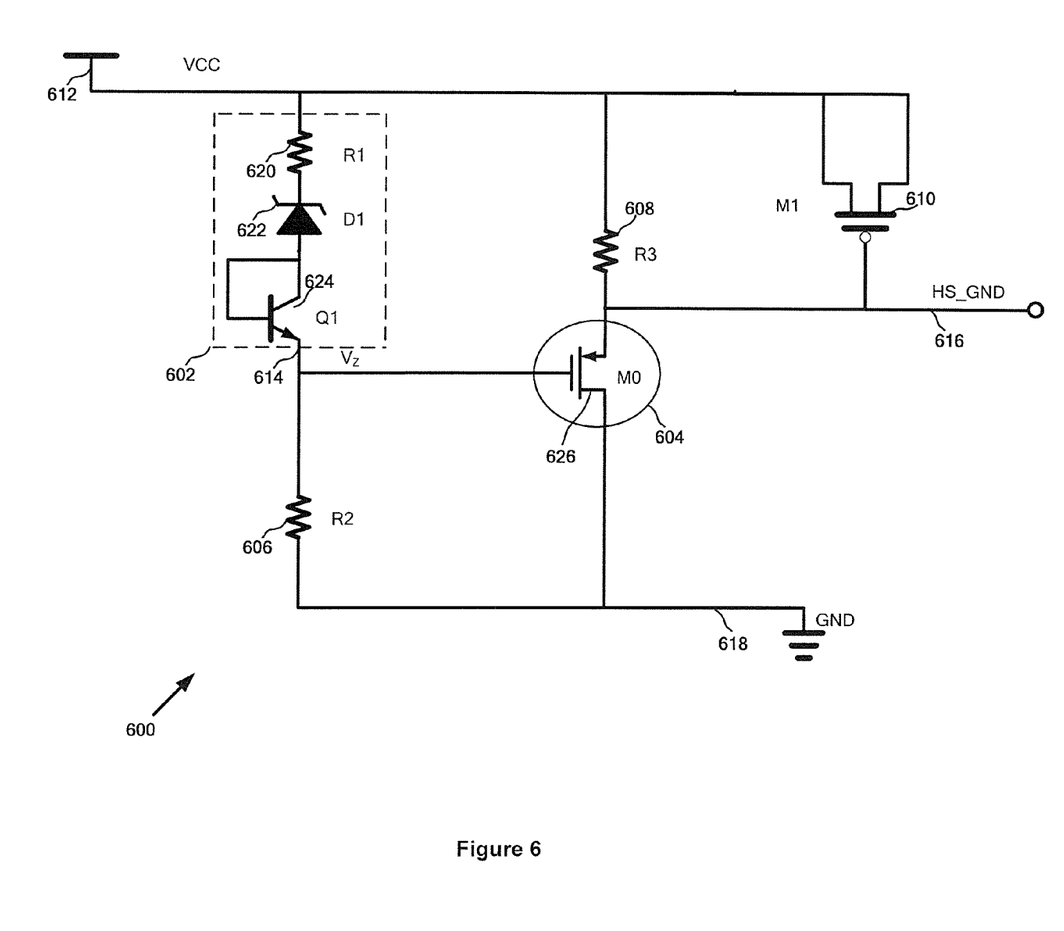
FIG. 6 is a simplified diagram showing a floating-ground component for generating a floating-ground signal according to another embodiment of the present invention.

FIG. 6 is a simplified diagram showing a floating-ground component 600 for generating a floating-ground signal according to another embodiment of the present invention. This diagram is merely an example, which should not unduly limit the scope of the claims. One of ordinary skill in the art would recognize many variations, alternatives, and modifications.

The floating-ground component 600 includes a reference-voltage generator 602, a current sink 604, two resistors 606 and 608, and a transistor 610. The reference-voltage generator 602 includes a resistor 620, a diode 622, and a transistor 624. The current sink 604 includes a transistor 626. For example, the floating-ground component 600 is the same as the floating-ground component 336 as part of the gate-driving system 300. In another example, the floating-ground component 600 is the same as the floating-ground component 400. In yet another example, the diode 622 is a Zener diode. In yet another example, the transistor 624 is an N-P-N bipolar junction transistor (BJT). In yet another example, the transistor 626 is a P-channel FET. In yet another example, the transistor 610 is a P-channel FET.

According to one embodiment, the source and drain of the transistor 610 are coupled together. For example, the resistor 608 and the transistor 610 are coupled with each other. In another example, the resistor 608 and the transistor 610 are coupled to the current sink 604 and the reference-voltage generator 602. In yet another example, the resistor 606 is coupled to the reference-voltage generator 602 and the current sink 604.

According to another embodiment, a high-level bias voltage 612 (e.g., $V_{CC}$) is provided to the reference-voltage generator 602, the resistor 608 and the transistor 610. For example, the reference-voltage generator 602 in response generates a reference voltage signal 614 (e.g., $V_Z$). In another example, the resistor 606 and the current sink 604 receive the reference voltage signal 614 (e.g., $V_Z$). In yet another example, the current sink 604 and the resistor 606 also receive a low-level bias voltage 618 (e.g., GND). In yet another example, a floating-ground signal 616 (e.g., HS_GND) is generated by the floating-ground component 600. In yet another example, the difference between the high-level bias voltage 612 (e.g., $V_{CC}$) and the floating-ground signal 616 (e.g., HS_GND) can be kept no larger than a predetermined voltage $V_3$ by properly adjusting the reference voltage signal 614 (e.g., $V_Z$) and the voltage of the current sink 604. In yet another example, the floating-ground signal 616 (e.g., HS_GND) is lower than the high-level bias voltage 612 (e.g., $V_{CC}$). In yet another example, the floating-ground signal 616 (e.g., HS_GND) is the same as the floating-ground signal 350 or the floating-ground signal 416. In yet another example, the high-level bias voltage 612 (e.g., $V_{CC}$) is 10 V. In yet another example, the predetermined voltage $V_3$ is 5 V.

According to yet another embodiment, the resistor 620 and the transistor 624 operate for adjusting the difference between the high-level bias voltage 612 (e.g., $V_{CC}$) and the floating-ground signal 616 (e.g., HS_GND). For example, the transistor 626 operates together with the resistor 608 for sinking currents and keeping the magnitude of the floating-ground signal 616 (e.g., HS_GND) approximately at a desired level. In another example, the transistor 610 operates as a capacitor to keep the difference between the high-level bias voltage 612 (e.g., $V_{CC}$) and the floating-ground signal 616 (e.g., HS_GND) from changing significantly. In yet another example, the transistor 626 receives the voltage signal 614 (e.g., $V_Z$), and operates together with the resistor 608 to form a source follower as a current sink.

Figure 7:
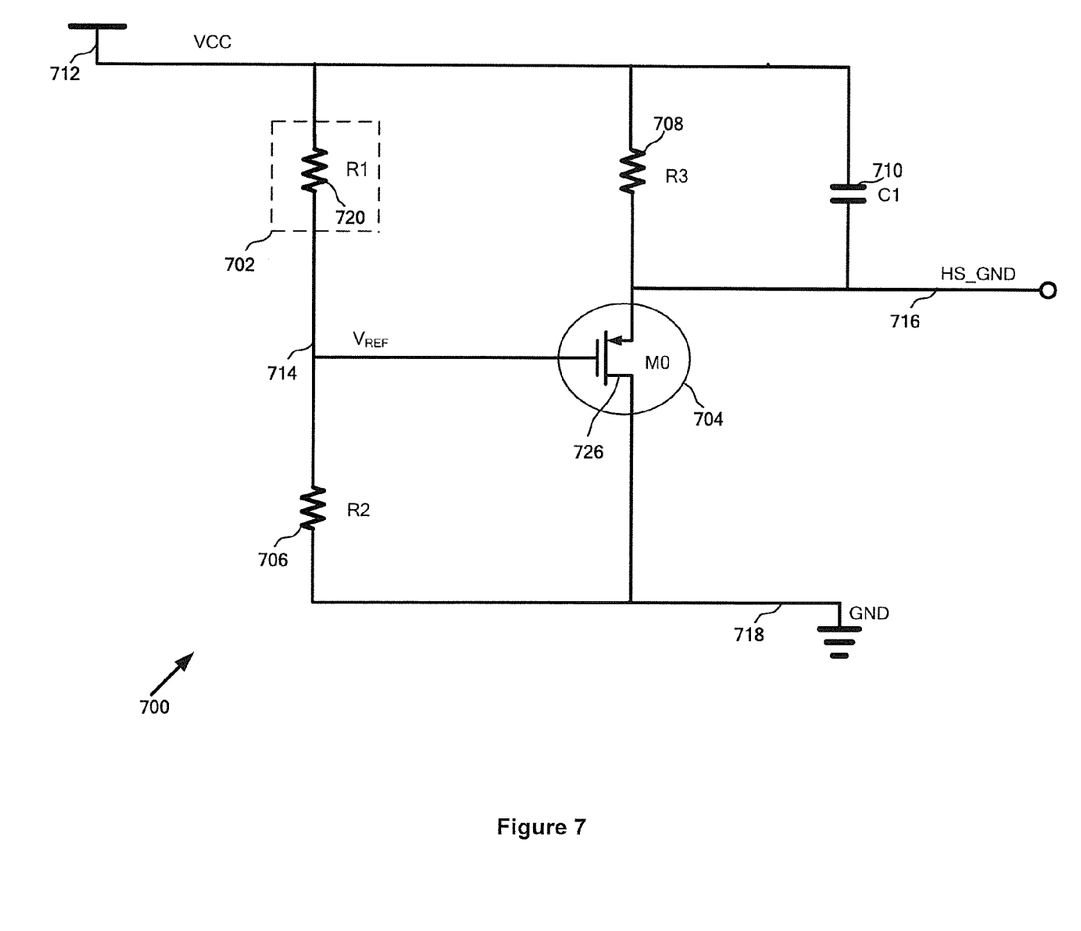
FIG. 7 is a simplified diagram showing a floating-ground component for generating a floating-ground signal according to yet another embodiment of the present invention.

FIG. 7 is a simplified diagram showing a floating-ground component 700 for generating a floating-ground signal according to yet another embodiment of the present invention. This diagram is merely an example, which should not unduly limit the scope of the claims. One of ordinary skill in the art would recognize many variations, alternatives, and modifications.

The floating-ground component 700 includes a reference-voltage generator 702, a current sink 704, two resistors 706 and 708, and a capacitor 710. The reference-voltage generator 702 includes a resistor 720. The current sink 704 includes a transistor 726. For example, the floating-ground component 700 is the same as the floating-ground component 336 as part of the gate-driving system 300. In another example, the floating-ground component 700 is the same as the floating-ground component 400. In yet another example, the transistor 726 is a P-channel FET.

According to one embodiment, the resistor 708 and the capacitor 710 are coupled with each other in parallel. In another example, the resistor 708 and the capacitor 710 are coupled to the current sink 704 and the reference-voltage generator 702. In yet another example, the resistor 706 is coupled to the reference-voltage generator 702 and the current sink 704.

According to another embodiment, a high-level bias voltage 712 (e.g., $V_{CC}$) is provided to the reference-voltage generator 702, the resistor 708 and the capacitor 710. For example, the reference-voltage generator 702 in response generates a reference voltage signal 714 (e.g., $V_{REF}$). In another example, if the high-level bias voltage 712 (e.g., $V_{CC}$) is constant in magnitude, the reference voltage signal 714 (e.g., $V_{REF}$) is generated based on the voltage division between the resistors 720 and 706. In another example, the resistor 706 and the current sink 704 receive the reference voltage signal 714 (e.g., $V_{REF}$). In yet another example, the current sink 704 and the resistor 706 also receive a low-level bias voltage 718 (e.g., GND). In yet another example, a floating-ground signal 716 (e.g., HS_GND) is generated by the floating-ground component 700. In yet another example, the difference between the high-level bias voltage 712 (e.g., $V_{CC}$) and the floating-ground signal 716 (e.g., HS_GND) can be kept no larger than a predetermined voltage $V_4$ by properly adjusting the reference voltage signal 714 (e.g., $V_{REF}$) and the voltage of the current sink 704. In yet another example, the floating-ground signal 716 (e.g., HS_GND) is lower than the high-level bias voltage 712 (e.g., $V_{CC}$). In yet another example, the floating-ground signal 716 (e.g., HS_GND) is the same as the floating-ground signal 350 or the floating-ground signal 416. In yet another example, the high-level bias voltage 712 (e.g., $V_{CC}$) is 10 V. In yet another example, the predetermined voltage $V_4$ is 5 V. In yet another example, the resistance of the resistors 720 and 706 can be adjusted in order to outputting the floating-ground signal 716 with a proper magnitude. In yet another example, the transistor 726 receives the voltage signal 714 and operates together with the resistor 708 to form a source follower as a current sink.

Figure 8:
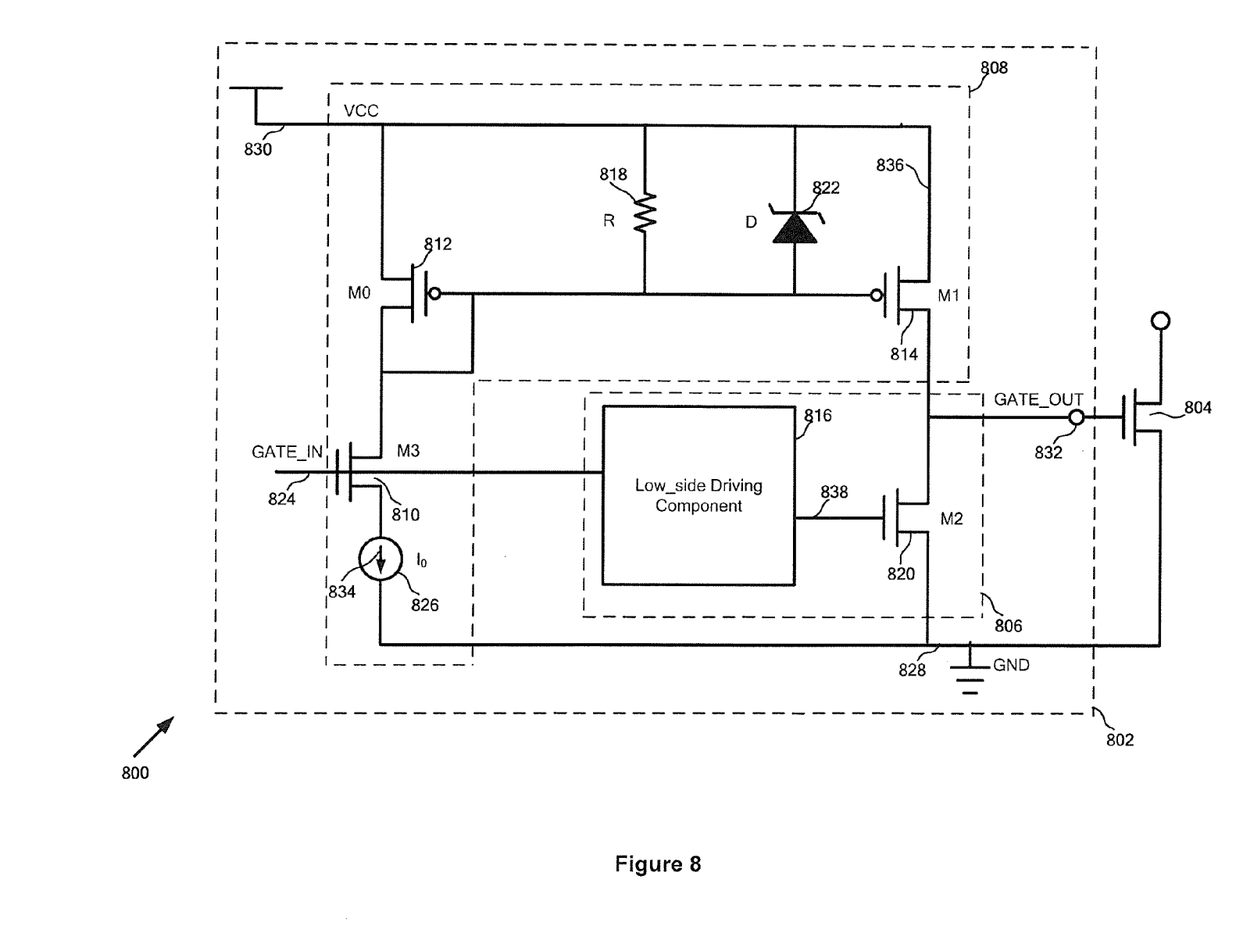
FIG. 8 is a simplified diagram showing a system for driving a transistor according to another embodiment of the present invention.

FIG. 8 is a simplified diagram showing a system 800 for driving a transistor according to another embodiment of the present invention. This diagram is merely an example, which should not unduly limit the scope of the claims. One of ordinary skill in the art would recognize many variations, alternatives, and modifications.

The gate-driving system 800 includes a gate driver 802 and a transistor 804. The gate driver 802 includes a low-side driver 806 and a high-side driver 808. The low-side driver 806 includes a low-side driving component 816 and a transistor 820. The high-side driver 808 includes two transistors 812 and 814, a resistor 818, a diode 822, a switch 810 and a current sink 826. For example, the diode 822 is a Zener diode. In another example, the transistors 812 and 814 are P-channel FETs, and are included in a current mirror circuit. In yet another example, the switch 810 is an N-channel FET. In yet another example, the transistor 820 is an N-channel FET. In yet another example, a low-level bias voltage 828 (e.g., GND) is provided to the low-side driver 806. In yet another example, a high-level bias voltage 830 (e.g., $V_{CC}$) is provided to the high-side driver 808. In yet another example, the bias voltage 830 (e.g., $V_{CC}$) is 10 V.

According to one embodiment, an input signal 824 (e.g., GATE_IN) is provided to both the low-side driver 806 and the high-side driver 808. For example, in response, the gate driver 802 generates an output signal 832 (e.g., GATE_OUT) to drive the transistor 804. In another example, in operation, the low-side driving component 816 receives the input signal 824 (e.g., GATE_IN), and generates in response a signal 838 to drive the transistor 820. In yet another example, if the input signal 824 (e.g., GATE_IN) is at the logic high level, the signal 838 is at a logic low level, and the transistor 820 is turned off. In yet another example, the input signal 824 (e.g., GATE_IN) is provided to the low-side driving component 816 directly, without going through the switch 810.

According to another embodiment, the high-side driver 808 receives the input signal 824 (e.g., GATE_IN) at the switch 810. For example, if the input signal 824 (e.g., GATE IN) is at a logic high level, the switch 810 is closed (e.g., on). In yet another example, the current sink 826 generates a current 834 that flows through the switch 810 and the transistor 812. In yet another example, the current 834 is mirrored by the transistor 814, with a predetermined ratio, to generate a current 836 that flows through the transistor 814. Hence, the output signal 832 increases in magnitude according to certain embodiments. For example, the current 834 and the physical properties of the transistors 812 and 814 can be adjusted properly to control the current 836. In another example, the resistor 818 and the diode 822 operate to keep the transistors 812 and 814 functioning properly.

According to yet another embodiment, a system for driving a transistor includes a floating-voltage generator, a first driving circuit, and a second driving circuit. The floating-voltage generator is configured to receive a first bias voltage and generate a floating voltage, the floating-voltage generator being further configured to change the floating voltage if the first bias voltage changes and to maintain the floating voltage to be lower than the first bias voltage by a first predetermined value in magnitude. The first driving circuit is configured to receive an input signal, the first bias voltage and the floating voltage. The second driving circuit is configured to receive the input signal, a second bias voltage and a third bias voltage, the first driving circuit and the second driving circuit being configured to generate an output signal to drive a transistor. Additionally, the first driving circuit includes a first driving transistor, the first driving transistor being configured to receive the first bias voltage and a first gate signal, the first gate signal being associated with at least the input signal, the first bias voltage, and the floating voltage. The second driving circuit includes a second driving transistor, the second driving transistor being configured to receive the third bias voltage and a second gate signal, the second gate signal being associated with at least the input signal, the second bias voltage, and the third bias voltage. The first driving transistor and the second driving transistor are further configured to generate the output signal. Moreover, if the first driving transistor is turned on by the first gate signal, the second driving transistor is turned off by the second gate signal. If the first driving transistor is turned off by the first gate signal, the second driving transistor is turned on by the second gate signal. For example, the system is implemented according to at least FIG. 3, FIG. 4, FIG. 5, FIG. 6, and/or FIG. 7.

In one embodiment, a method for driving a transistor includes receiving a first bias voltage, processing information associated with the first bias voltage, and generating a floating voltage based on at least information associated with the first bias voltage. The method further includes receiving an input signal, the first bias voltage, a second bias voltage, a third bias voltage, and the floating voltage, processing information associated with the input signal, the first bias voltage, the second bias voltage, the third bias voltage and the floating voltage, and generating an output signal to drive a transistor based on at least information associated with the input signal, the first bias voltage, the second bias voltage, the third bias voltage and the floating voltage. Additionally, the process for generating the floating voltage based on at least information associated with the first bias voltage includes: changing the floating voltage if the first bias voltage changes, and maintaining the floating voltage to be lower than the first bias voltage by a first predetermined value in magnitude. For example, the method is implemented according to at least FIG. 3, FIG. 4, FIG. 5, FIG. 6, and/or FIG. 7.

According to another embodiment, a system for driving a transistor includes a first driving circuit and a second driving circuit. The first driving circuit is configured to receive an input signal, a first bias voltage and a second bias voltage, the first driving circuit including a current mirror circuit, a switch, and a current sink. The second driving circuit is configured to receive the input signal and the second bias voltage, the first driving circuit and the second driving circuit being configured to generate an output signal to drive a transistor. Additionally, the switch is configured to receive the input signal. The current sink is configured to generate a first current. The current mirror circuit is coupled to the current sink through the switch and configured to generate a second current based on the first current. Moreover, the output signal is generated based on at least information associated with the second current. For example, the system is implemented according to at least FIG. 8.

According to yet another embodiment, a method of driving a transistor includes receiving an input signal, a first bias voltage and a second bias voltage, processing information associated with the input signal, the first bias voltage and the second bias voltage, and generating a first current based on at least information associated with the input signal, the first bias voltage and the second bias voltage. The method further includes processing information associated with the first current, generating a second current based on at least information associated with the first current, and processing information associated with the second current. Additionally, the method includes generating an output signal to drive a transistor based on at least information associated with the second current. Moreover, the second current is proportional to the first current in magnitude. For example, the method is implemented according to at least FIG. 8.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for driving a transistor, the system comprising:
   a floating-voltage generator configured to receive a first bias voltage and generate a floating voltage, the floating-voltage generator being further configured to change the floating voltage if the first bias voltage changes and to maintain the floating voltage to be lower than the first bias voltage by a first predetermined value in magnitude;
   a first driving circuit configured to receive an input signal, the first bias voltage and the floating voltage; and
   a second driving circuit configured to receive the input signal, a second bias voltage and a third bias voltage, the first driving circuit and the second driving circuit being configured to generate an output signal to drive a transistor;
   wherein:
      the first driving circuit includes a first driving transistor, the first driving transistor being configured to receive the first bias voltage and a first gate signal, the first gate signal being associated with at least the input signal, the first bias voltage, and the floating voltage;
      the second driving circuit includes a second driving transistor, the second driving transistor being configured to receive the third bias voltage and a second gate signal, the second gate signal being associated with at least the input signal, the second bias voltage, and the third bias voltage; and
      the first driving transistor and the second driving transistor are further configured to generate the output signal;
   wherein:
      if the first driving transistor is turned on by the first gate signal, the second driving transistor is turned off by the second gate signal; and
      if the first driving transistor is turned off by the first gate signal, the second driving transistor is turned on by the second gate signal;
   wherein:
      the floating-voltage generator includes a reference-voltage generator and a current sinking component;
      the reference-voltage generator is configured to receive the first bias voltage and generate a reference voltage; and
      the current sinking component is configured to receive the reference voltage and generate the floating voltage;
      wherein the current sinking component is further configured to sink one or more currents.

2. The system of claim 1 wherein the reference-voltage generator is further configured to change the reference voltage if the first bias voltage changes and to maintain the reference voltage to be lower than the first bias voltage by a second predetermined value in magnitude.

3. The system of claim 2 wherein the second predetermined value is different from the first predetermined value.

4. The system of claim 1 wherein the first driving circuit and the second driving circuit are further configured to change the output signal from the third bias voltage to the first bias voltage and from the first bias voltage to the third bias voltage.

5. The system of claim 1 wherein the third bias voltage is ground.

6. The system of claim 1 wherein the first driving transistor is a P-channel field effect transistor.

7. The system of claim 6 wherein the second driving transistor is an N-channel field effect transistor.

8. A system for driving a transistor, the system comprising:
   a floating-voltage generator configured to receive a first bias voltage and generate a floating voltage, the floating-voltage generator being further configured to change the floating voltage if the first bias voltage changes and to maintain the floating voltage to be lower than the first bias voltage by a first predetermined value in magnitude;
   a first driving circuit configured to receive an input signal, the first bias voltage and the floating voltage; and
   a second driving circuit configured to receive the input signal, a second bias voltage and a third bias voltage, the first driving circuit and the second driving circuit being configured to generate an output signal to drive a transistor;
   wherein:
      the first driving circuit includes a first driving transistor, the first driving transistor being configured to receive the first bias voltage and a first gate signal, the first gate signal being associated with at least the input signal, the first bias voltage, and the floating voltage;
      the second driving circuit includes a second driving transistor, the second driving transistor being configured to receive the third bias voltage and a second gate signal, the second gate signal being associated with at least the input signal, the second bias voltage, and the third bias voltage; and
      the first driving transistor and the second driving transistor are further configured to generate the output signal;
   wherein:
      if the first driving transistor is turned on by the first gate signal, the second driving transistor is turned off by the second gate signal; and
      if the first driving transistor is turned off by the first gate signal, the second driving transistor is turned on by the second gate signal;
   wherein:
      the floating-voltage generator includes a reference-voltage generator and a current sinking component;
      the reference-voltage generator is configured to receive the first bias voltage and generate a reference voltage; and
      the current sinking component is configured to receive the reference voltage and generate the floating voltage;
   wherein:
      the floating-voltage generator further includes a first resistor, a second resistor and a capacitor, the first resistor including a first resistor terminal and a second resistor terminal, the second resistor including a third resistor terminal and a fourth resistor terminal, the capacitor including a first capacitor terminal and a second capacitor terminal;
   wherein:
      the first resistor is coupled to the reference-voltage generator and the current sinking component at the first resistor terminal, and configured to receive a fourth bias voltage at the second resistor terminal;

the second resistor is coupled to the reference-voltage generator at the third resistor terminal, and coupled to the current sinking component at the fourth resistor terminal; and the capacitor is coupled to the reference-voltage generator at the first capacitor terminal, and coupled to the current sinking component at the second capacitor terminal.

9. The system of claim 8 wherein the capacitor includes a first transistor, the first transistor including a first transistor terminal, a second transistor terminal and a third transistor terminal, the first transistor terminal and the second transistor terminal being coupled to each other.

10. The system of claim 8 wherein:

the reference-voltage generator includes a third resistor, a diode, and a first transistor, the third resistor including a fifth resistor terminal and a sixth resistor terminal, the diode including a first diode terminal and a second diode terminal, the first transistor including a first transistor terminal, a second transistor terminal and a third transistor terminal;

wherein:

the fifth resistor terminal is coupled to the first diode terminal;

the second diode terminal is coupled to the first transistor terminal; and the second transistor terminal is coupled to the first transistor terminal.

11. The system of claim 10 wherein the current sinking component includes an emitter follower.

12. The system of claim 10 wherein the current sinking component includes a source follower.

13. The system of claim 10 wherein the current sinking component includes a second transistor and a third transistor, the second transistor including a fourth transistor terminal, a fifth transistor terminal and a sixth transistor terminal, the third transistor including a seventh transistor terminal, an eighth transistor terminal and a ninth transistor terminal;

wherein:

the fourth transistor terminal is coupled to the third transistor terminal;

the fifth transistor terminal is coupled to the seventh transistor terminal; and the sixth transistor terminal and the ninth transistor terminal are biased to a fourth bias voltage.

14. The system of claim 13 wherein the fourth bias voltage is ground.

15. The system of claim 10 wherein the current sinking component includes a second transistor, the second transistor including a fourth transistor terminal, a fifth transistor terminal and a sixth transistor terminal;

wherein:

the fourth transistor terminal is coupled to the third transistor terminal; and the sixth transistor terminal is biased to a fourth bias voltage.

16. The system of claim 10 wherein the diode is a Zener diode.

17. A system for driving a transistor, the system comprising:

a floating-voltage generator configured to receive a first bias voltage and generate a floating voltage, the floating-voltage generator being further configured to change the floating voltage if the first bias voltage changes and to maintain the floating voltage to be lower than the first bias voltage by a first predetermined value in magnitude;

a first driving circuit configured to receive an input signal, the first bias voltage and the floating voltage; and a second driving circuit configured to receive the input signal, a second bias voltage and a third bias voltage, the first driving circuit and the second driving circuit being configured to generate an output signal to drive a transistor;

wherein:

the first driving circuit includes a first driving transistor, the first driving transistor being configured to receive the first bias voltage and a first gate signal, the first gate signal being associated with at least the input signal, the first bias voltage, and the floating voltage;

the second driving circuit includes a second driving transistor, the second driving transistor being configured to receive the third bias voltage and a second gate signal, the second gate signal being associated with at least the input signal, the second bias voltage, and the third bias voltage; and the first driving transistor and the second driving transistor are further configured to generate the output signal;

wherein:

if the first driving transistor is turned on by the first gate signal, the second driving transistor is turned off by the second gate signal; and if the first driving transistor is turned off by the first gate signal, the second driving transistor is turned on by the second gate signal;

wherein:

the floating-voltage generator includes a reference-voltage generator and a current sinking component;

the reference-voltage generator is configured to receive the first bias voltage and generate a reference voltage; and the current sinking component is configured to receive the reference voltage and generate the floating voltage;

wherein:

the floating-voltage generator further includes a first resistor, the first resistor including a first resistor terminal and a second resistor terminal; and the reference-voltage generator includes a second resistor, the second resistor including a third resistor terminal and a fourth resistor terminal;

wherein:

the second resistor is configured to receive the first bias voltage at the third resistor terminal;

the fourth resistor terminal is coupled to the first resistor terminal; and the first resistor is configured to receive a fourth bias voltage at the second resistor terminal.

18. The system of claim 17 wherein the current sinking component includes a first transistor, the first transistor including a first transistor terminal, a second transistor terminal and a third transistor terminal;

wherein:

the first transistor terminal is coupled to the first resistor terminal; and the second transistor terminal is biased to the fourth bias voltage.

19. A system for driving a transistor, the system comprising:

a floating-voltage generator configured to receive a first bias voltage and generate a floating voltage, the floating-voltage generator being further configured to change the floating voltage if the first bias voltage changes and to maintain the floating voltage to be lower than the first bias voltage by a first predetermined value in magnitude;

a first driving circuit configured to receive an input signal, the first bias voltage and the floating voltage; and a second driving circuit configured to receive the input signal, a second bias voltage and a third bias voltage, the first driving circuit and the second driving circuit being configured to generate an output signal to drive a transistor;

wherein:
the first driving circuit includes a first driving transistor, the first driving transistor being configured to receive the first bias voltage and a first gate signal, the first gate signal being associated with at least the input signal, the first bias voltage, and the floating voltage;
the second driving circuit includes a second driving transistor, the second driving transistor being configured to receive the third bias voltage and a second gate signal, the second gate signal being associated with at least the input signal, the second bias voltage, and the third bias voltage; and
the first driving transistor and the second driving transistor are further configured to generate the output signal;

wherein:
if the first driving transistor is turned on by the first gate signal, the second driving transistor is turned off by the second gate signal; and
if the first driving transistor is turned off by the first gate signal, the second driving transistor is turned on by the second gate signal;
wherein the first driving circuit includes a plurality of inverters connected in cascade.

20. A system for driving a transistor, the system comprising:
a floating-voltage generator configured to receive a first bias voltage and generate a floating voltage, the floating-voltage generator being further configured to change the floating voltage if the first bias voltage changes and to maintain the floating voltage to be lower than the first bias voltage by a first predetermined value in magnitude;
a first driving circuit configured to receive an input signal, the first bias voltage and the floating voltage; and
a second driving circuit configured to receive the input signal, a second bias voltage and a third bias voltage, the first driving circuit and the second driving circuit being configured to generate an output signal to drive a transistor;
wherein:
the first driving circuit includes a first driving transistor, the first driving transistor being configured to receive the first bias voltage and a first gate signal, the first gate signal being associated with at least the input signal, the first bias voltage, and the floating voltage;
the second driving circuit includes a second driving transistor, the second driving transistor being configured to receive the third bias voltage and a second gate signal, the second gate signal being associated with at least the input signal, the second bias voltage, and the third bias voltage; and
the first driving transistor and the second driving transistor are further configured to generate the output signal;

wherein:
if the first driving transistor is turned on by the first gate signal, the second driving transistor is turned off by the second gate signal; and
if the first driving transistor is turned off by the first gate signal, the second driving transistor is turned on by the second gate signal;
wherein the second driving circuit includes a plurality of inverters connected in cascade.

21. A system for driving a transistor, the system comprising:
a first driving circuit configured to receive an input signal, a first bias voltage and a second bias voltage, the first driving circuit including a current mirror circuit, a switch, and a current sink; and
a second driving circuit configured to receive the input signal and the second bias voltage, the first driving circuit and the second driving circuit being configured to generate an output signal to drive a transistor;
wherein:
the switch is configured to receive the input signal;
the current sink is configured to generate a first current;
the current mirror circuit is coupled to the current sink through the switch and configured to generate a second current based on the first current; and
the output signal is generated based on at least information associated with the second current.

22. The system of claim 21 wherein the first driving circuit and the second driving circuit are further configured to change the output signal from the second bias voltage to the first bias voltage and from the first bias voltage to the second bias voltage.

23. The system of claim 21 wherein:
the current mirror circuit includes a first transistor and a second transistor;
the first transistor includes a first transistor terminal, a second transistor terminal and a third transistor terminal;
the second transistor includes a fourth transistor terminal, a fifth transistor terminal and a sixth transistor terminal;
the first transistor terminal and the fourth transistor terminal are biased to the first bias voltage;
the second transistor terminal is coupled to the fifth transistor terminal; and
the second transistor terminal is coupled to the third transistor terminal;
wherein:
the second transistor is configured to generate the second current by mirroring the first current with a predetermined ratio.

24. The system of claim 23 wherein:
the first driving circuit further includes a resistor and a diode, the resistor including a first resistor terminal and a second resistor terminal, the diode including a first diode terminal and a second diode terminal;
the first resistor terminal is coupled to the first diode terminal;
the second resistor terminal is coupled to the second diode terminal;
the first resistor terminal is coupled to the first transistor terminal; and
the second resistor terminal is coupled to the second transistor terminal.

25. The system of claim 24 wherein:
the second driving circuit includes a third transistor, the third transistor including a seventh transistor terminal, an eighth transistor terminal and a ninth transistor terminal;

the seventh transistor terminal is coupled to the sixth transistor terminal; and the ninth transistor terminal is biased to the second bias voltage.

26. The system of claim 21 wherein the switch is a transistor.

* * * * *